US012127422B2

(12) United States Patent
Luo

(10) Patent No.: US 12,127,422 B2
(45) Date of Patent: Oct. 22, 2024

(54) DISPLAY PANEL, PACKAGING DEVICE, PACKAGING METHOD AND DISPLAY DEVICE

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 679 days.

(21) Appl. No.: 17/280,872

(22) PCT Filed: Jun. 8, 2020

(86) PCT No.: PCT/CN2020/094900
§ 371 (c)(1),
(2) Date: Mar. 27, 2021

(87) PCT Pub. No.: WO2020/248933
PCT Pub. Date: Dec. 17, 2020

(65) Prior Publication Data
US 2021/0408447 A1 Dec. 30, 2021

(30) Foreign Application Priority Data
Jun. 13, 2019 (CN) .......................... 201910509000.7

(51) Int. Cl.
H10K 50/842 (2023.01)
H10K 71/00 (2023.01)
(52) U.S. Cl.
CPC ......... H10K 50/8426 (2023.02); H10K 71/00 (2023.02)

(58) Field of Classification Search
CPC ........................... H10K 71/00; H10K 50/8426
See application file for complete search history.

(56) References Cited

U.S. PATENT DOCUMENTS 8,299,706 B2 * 10/2012 Otterman .............. C03C 14/006
445/25
2014/0292185 A1 * 10/2014 Moon ................ H10K 50/8426
156/154

FOREIGN PATENT DOCUMENTS

CN 1617636 A 5/2005
CN 104993067 A 10/2015
(Continued)

OTHER PUBLICATIONS

China Patent Office, First Office Action issued Nov. 30, 2020 for application No. CN201910509000.7.
(Continued)

Primary Examiner — Karabi Guharay
(74) Attorney, Agent, or Firm — HOUTTEMAN LAW LLC

(57) ABSTRACT

The present disclosure provides a display panel, a packaging device and a packaging method, relates to the field of display panel technology, solves the problem that the sealing effect of the display panel is poor. The display panel of the present disclosure includes: a panel body; a packaging layer located on a surface of the panel body; a cover plate located on a surface of the packaging layer away from the panel body, where the packaging layer includes a packaging adhesive layer and hydrophobic fibers, the packaging adhesive layer packages the panel body and the cover plate, and the hydrophobic fibers are located on peripheral sides of the packaging adhesive layer. The present disclosure is mainly used for packaging a display panel.

20 Claims, 3 Drawing Sheets

(56) References Cited

FOREIGN PATENT DOCUMENTS

| | | | |
|---|---|---|---|
| CN | 105870356 | A | 8/2016 |
| CN | 109103347 | A | 12/2018 |
| CN | 109216586 | A | 1/2019 |
| CN | 110098350 | A | 8/2019 |
| JP | 2000068046 | A | 3/2000 |
| JP | 2017073554 | A | 4/2017 |

OTHER PUBLICATIONS

China Patent Office, Second Office Action issued Mar. 12, 2021 for application No. CN201910509000.7.
China Patent Office, Decision of Rejection issued Jul. 6, 2021 for application No. CN201910509000.7.

* cited by examiner step S1, forming the hydrophobic fibers in the preset areas of the pressing molds, and forming the packaging adhesive layer on the cover plate at the same time

step S2, placing the pressing molds on the edges of the cover plate, so that the preset areas of the pressing molds are right opposite to the peripheral sides of the packaging adhesive layer

step S3, pressing the panel body and the cover plate together, so that the packaging adhesive layer is diffused to the hydrophobic fibers, and the hydrophobic fibers in the preset areas are transferred to the sides of the packaging adhesive layer

FIG. 7

DISPLAY PANEL, PACKAGING DEVICE, PACKAGING METHOD AND DISPLAY DEVICE

CROSS REFERENCE TO RELATED APPLICATIONS

This application claims priority to Chinese patent application No. 201910509000.7 filed at Chinese Intellectual Property Office on Jun. 13, 2019, the entire contents of which are incorporated herein by reference.

TECHNICAL FIELD

The present disclosure relates to the field of display panel technologies, and in particular, to a display panel, a packaging device, a packaging method and a display device.

BACKGROUND

Active Matrix Organic Light Emitting Diodes (AMO-LEDs) have gradually attracted much attention due to their capability of achieving high color gamut, ultra-thin, and flexible displays. Especially curved and flexible OLEDs are much favored due to unique functionality and superior user experience.

SUMMARY

An embodiment of the present disclosure provides a display panel, including:
a panel body;
a packaging layer on a surface of the panel body;
a cover plate on a surface of the packaging layer away from the panel body, where the packaging layer includes a packaging adhesive layer and hydrophobic fibers, the packaging adhesive layer packages the panel body and the cover plate, and the hydrophobic fibers are located on peripheral sides of the packaging adhesive layer.

In some implementations, the hydrophobic fibers are fluffy and are densely arranged on the peripheral sides of the packaging adhesive layer.

In some implementations, the packaging adhesive layer includes a packaging adhesive frame and a filling adhesive, the packaging adhesive frame is positioned at a preset distance from edges of the cover plate, the packaging adhesive frame encloses an annular accommodating space on the cover plate, the filling adhesive is located in the accommodating space, and
the hydrophobic fibers are located on the peripheral sides of the packaging adhesive frame away from the filling adhesive.

In some implementations, the hydrophobic fibers are located on the peripheral sides of the packaging adhesive layer in an array including a plurality of rows and a plurality of columns.

In some implementations, the hydrophobic fibers have a length ranging from 1 μm to 5 μm and a diameter ranging from 10 nm to 100 nm.

In some implementations, the hydrophobic fibers are composed of a first material and a second material, the first material is any one of $SiO_2$, $TiO_2$, ZnO and ZnS, and the second material is one or two of polystyrene and polyacrylonitrile.

In some implementations, the display panel is an OLED display panel.

An embodiment of the present disclosure provides a packaging device for forming the hydrophobic fibers of the display panel described above, the packaging device including:
a plurality of pressing molds that are spliced, the spliced pressing molds surround the packaging adhesive layer, each of the pressing molds is provided with a preset area on a side thereof proximal to the packaging adhesive layer, after the plurality of pressing molds are spliced together, preset areas are right opposite to the packaging adhesive layer, and each of the preset areas is provided with the hydrophobic fibers in advance.

In some implementations, each pressing mold includes a plate-shaped body, the plate-shaped body includes a first surface and a second surface which are opposite to each other, and further includes a third surface which is adjacent to the first surface and the second face, the third surface is the preset area, the first surface is configured to be pressed together with a surface, proximal to the cover plate, of the panel body, the second surface is configured to be pressed together with a surface, proximal to the panel body, of the cover plate, and the third surface is proximal to the packaging adhesive layer.

In some implementations, each pressing mold further includes: a plate-shaped base, which is coupled to a surface, away from the third surface, of the plate-shaped body and is perpendicular to the plate-shaped body, the plate-shaped body is formed into a protruding structure on the plate-shaped base, a surface, coupled to the plate-shaped body, of the plate-shaped base is divided into a first limiting surface and a second limiting surface by the plate-shaped body, the first limiting surface is adjacent to the first surface of the plate-shaped body, the second limiting surface is adjacent to the second surface of the plate-shaped body, the first limiting surface is configured to be attached to a side of the panel body, and the second limiting surface is configured to be attached to a side of the cover plate.

An embodiment of the present disclosure provides a packaging method for packaging the display panel described above, the packaging method including:
forming hydrophobic fibers in preset areas of the pressing molds;
forming a packaging adhesive layer on the cover plate;
splicing and mounting the pressing molds on edges of the cover plate, so that the preset areas of the pressing molds are right opposite to the peripheral sides of the packaging adhesive layer; and
pressing the panel body and the cover plate to ensure that the packaging adhesive layer is diffused to the hydrophobic fibers and the hydrophobic fibers in the preset areas of the pressing molds are transferred to the peripheral sides of the packaging adhesive layer.

An embodiment of the present disclosure provides a display device, including the foregoing display panel.

DESCRIPTION OF DRAWINGS

FIG. 7 is a schematic flowchart of a packaging method according to an embodiment of the present disclosure.

REFERENCE SIGNS 11-panel body, 111-substrate, 112-functional layer, 12-packaging adhesive layer, 121-packaging adhesive frame, 122-filling adhesive, 13-cover plate, 14-hydrophobic fibers, 21-pressing mold, 211-plate-shaped body, and 212-matrix.

DESCRIPTION OF EMBODIMENTS

In order to further elaborate the technical means adopted by the present disclosure to achieve the intended purpose of the present disclosure and the efficacy of the technical means, the following describes in detail the specific implementations, structures, features and efficacy of the display panel, the packaging device and the packaging method proposed according to the present disclosure in combination with the drawings and preferred embodiments.

In the related art, an OLED device is easily corroded by moisture and oxygen, organic materials and metal electrodes are very easy to react with moisture and oxygen to cause the OLED device failure, therefore, the OLED device needs to be packaged to prolong the service life thereof. The method for packaging the OLED device by adopting the resin adhesive material is a traditional packaging method, has the advantages of simple manufacturing process and better packaging effect, and has small stress after curing, and thus can avoid cracks, and can be applied to manufacturing large-size devices. However, the resin adhesive material has an unsatisfactory blocking effect on moisture, and moisture can still enter the interior of the display panel from side surfaces of the display panel, which causes damage to the OLED device. Therefore, how to improve a sealing effect of the display panel is a technical problem urgent to be solved by skills in the art.

Figure 1:
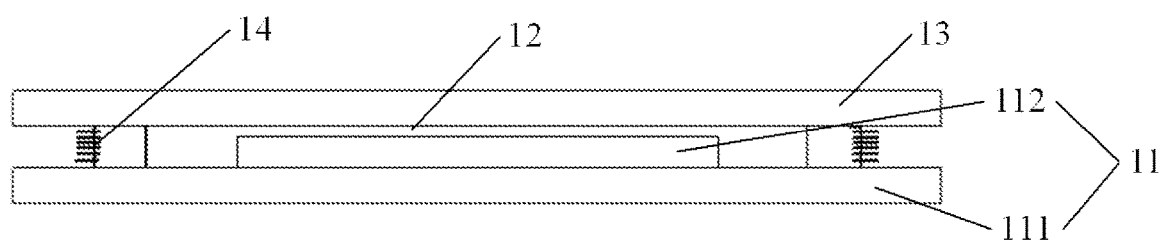
FIG. 1 is a schematic structural diagram of a display panel according to an embodiment of the present disclosure.

In a first aspect, as shown in FIG. 1, an embodiment of the present disclosure provides a display panel, including: a panel body 11, where a packaging adhesive layer 12 and a cover plate 13 are sequentially stacked on the panel body 11, and a layer of hydrophobic fibers 14 is arranged around the packaging adhesive layer 12. The panel body 11 is of a multi-layer structure and provided with an OLED device, if the panel body 11 is not packaged, the OLED device in the panel body 11 may be in contact with moisture and oxygen in the air, resulting in damage to the OLED device, and in order to protect the OLED device, a cover plate 13 is generally arranged on the panel body 11, and the cover plate 13 and the panel body 11 are bonded through the packaging adhesive layer 12, thus the panel body 11 is packaged.

The cover plate 13 may be a glass cover plate 13, the glass cover plate 13 can block moisture from entering the panel body 11 from the front side of the panel body 11 (that is, a surface of the glass cover plate away from the panel body 11 in FIG. 1), and the packaging adhesive layer 12 between the panel body 11 and the cover plate 13 not only can bond the panel body 11 and the cover plate 13 together, but also can package the peripheral sides of the panel body 11, thereby preventing moisture from entering the panel body 11 from the sides of the panel body 11. The main component of the packaging adhesive layer 12 is epoxy resin, including, for example, homopolymer or copolymer of monomers such as glycidyl acrylate, glycidyl methacrylate, methyl methacrylate, ethyl methacrylate, n-butyl methacrylate, 6, 7-epoxy heptyl methacrylate, 2-hydroxyethyl methacrylate and the like, additive materials such as melamine formaldehyde resin, unsaturated polyester resin, organic silicon resin, furan resin, which can be cured by adopting ultraviolet irradiation and heating. Although the packaging adhesive layer 12 has the function of blocking moisture, the sealing effect of the packaging adhesive layer 12 on the display panel is unsatisfactory.

In order to further improve the packaging effect of the packaging adhesive layer 12, hydrophobic fibers 14 are disposed on the peripheral sides of the packaging adhesive layer 12 away from the OLED device, where the peripheral sides of the packaging adhesive layer 12 refer to the peripheral sides of the packaging adhesive layer 12 not bonded to the panel body 11 and not bonded to the cover plate 13, as shown in FIG. 1, a surface of the packaging adhesive layer 12 away from the panel body 11 contacts the cover plate 13, and a surface of the packaging adhesive layer 12 away from the cover plate 13 contacts the panel body 11. The hydrophobic fibers 14 surround the packaging adhesive layer 12, that is, a layer of hydrophobic fibers 14 is arranged on outer sides of the periphery of the packaging adhesive layer 12, and the hydrophobic fibers 14 and the packaging adhesive layer 12 together form a packaging layer for packaging the display panel. The hydrophobicity of the hydrophobic fibers 14 can prevent moisture from staying on the side surfaces of the packaging adhesive layer 12, so that the probability that the moisture penetrates into the interior of the display panel from the packaging adhesive layer 12 is reduced, and the packaging effect is enhanced.

The purpose of the present disclosure and solving the technical problems thereof can be further achieved by the following technical measures.

Specifically, as shown in FIG. 1, the hydrophobic fibers 14 are fluffy and densely arranged on the peripheral sides of the packaging adhesive layer 12, so as to form a layer of hydrophobic fibers 14 around the packaging adhesive layer 12. A plurality of fluffy hydrophobic fibers 14 are arranged on the peripheral sides of the packaging adhesive layer 12, and the fluffy hydrophobic fibers 14 may be transferred to the peripheral sides of the packaging adhesive layer 12 through a mold. The hydrophobic fibers 14 may be formed using a lateral film forming process.

Figure 2:
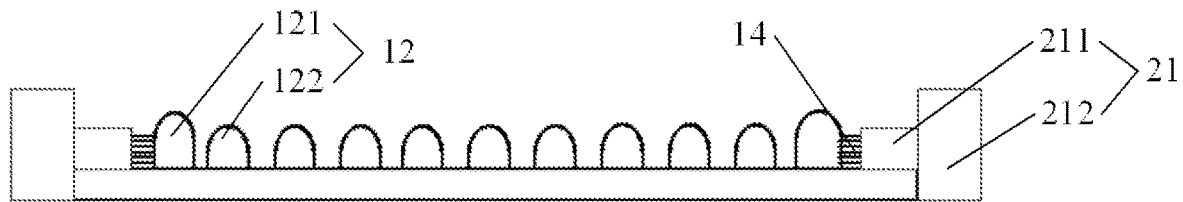
FIG. 2 is a schematic structural diagram of a display panel and a packaging device according to an embodiment of the present disclosure.
Figure 3:
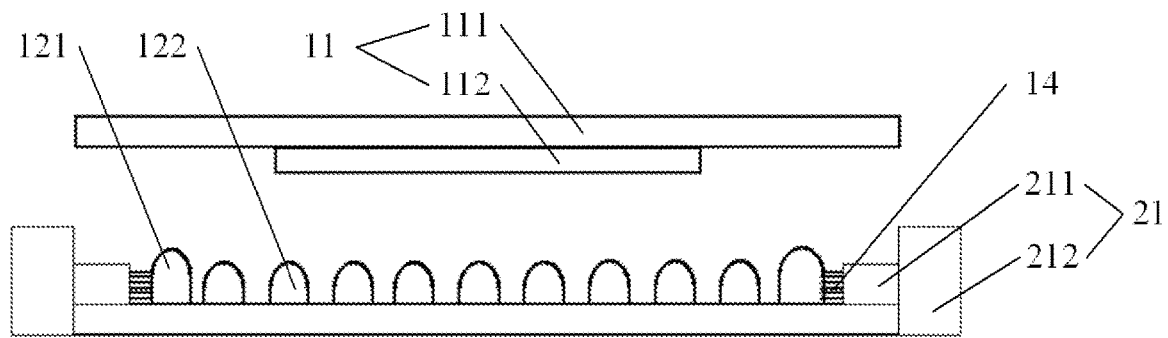
FIG. 3 is another schematic structural diagram of a display panel and a packaging device according to an embodiment of the present disclosure.

Specifically, as shown in FIG. 2 and FIG. 3, a packaging adhesive frame 121 is disposed at a preset distance from the peripheral edges of the cover plate 13, the packaging adhesive frame 121 forms an accommodating space on the cover plate 13, and a filling adhesive 122 is disposed in the accommodating space, the hydrophobic fibers 14 are disposed on the peripheral sides of the packaging adhesive frame 121 away from the filling adhesive 122, and the hydrophobic fibers 14 are disposed around the packaging adhesive frame 121. The materials of the filling adhesive 122 and the packaging adhesive frame 121 have been mentioned above, and are not described herein again, the materials of the filling adhesive 122 and the packaging adhesive frame 121 are the same, and the viscosities of the packaging adhesive frame 121 and the filling adhesive 122 are adjusted by adjusting proportion of each additive material, where the viscosity of the adhesive material forming the packaging adhesive frame 121 ranges from 100000 mPa·s to 400000 mPa·s; the viscosity of the filling adhesive 122 ranges from 100 mPa·s to 2000 mPa·s, the relative high viscosity of the packaging adhesive frame 121 can ensure the sealing property between the cover plate 13 and the panel body 11, the fluidity of the packaging adhesive frame 121 is lower, and the viscosity of the filling adhesive 122 is relative low, the fluidity of the filling adhesive 122 is relative high, when the panel body 11 and the cover plate 13 are pressed together, the filling adhesive 122 can be uniformly diffused in the accommodating space, so as to form a uniform filling adhesive layer with a uniform thickness. When the packaging adhesive frame 121 is coated, a preset distance is reserved between the packaging adhesive frame 121 and the peripheral edges of the glass cover plate, so that a reserved space can be formed between the packaging adhesive frame 121 and the edges of the cover plate 13 for the arranging the hydrophobic fibers 14, the pressing molds 21 can be arranged in the reserved space, after packaging is finished, the hydrophobic fibers 14 can be arranged in the reserved space, and at the moment, the hydrophobic fibers 14 still have a certain distance from each of the edges of the cover plate 13. The panel body 11 includes a substrate 111 and a functional layer 112, the substrate 111 covers the functional layer 112 completely, that is, an orthographic projection of the functional layer 112 on the substrate 111 completely falls within the substrate 111, where an area where the functional layer 112 is located can be regarded as a display area of the display panel. An area of the display panel except for the functional layer 112 is a non-display area, and the non-display area surrounds the display area, where the packaging adhesive frame 121 and the hydrophobic fibers 14 may be both arranged in the non-display area. The functional layer 112 can be completely wrapped by the filling adhesive 122, the filling adhesive 122 is uniformly filled between the functional layer 112 and the cover plate 13, the packaging adhesive frame 121 is arranged around the periphery of the filling adhesive 122, and a layer of hydrophobic fibers 14 is arranged around the periphery of the packaging adhesive frame 121.

Specifically, the hydrophobic fibers 14 are arranged in an array on the peripheral sides of the packaging adhesive layer 12. The hydrophobic fibers 14 are uniformly arranged in an array on the peripheral sides of the packaging adhesive layer 12, so that the sealing performance can be kept uniform throughout the peripheral sides of the packaging adhesive layer 12.

Specifically, a length of the hydrophobic fiber ranges from 1 μm to 5 μm, and a diameter of the hydrophobic fiber ranges from 10 nm to 100 nm. Hydrophobic fibers 14 with such dimensions can avoid harm to humans.

Specifically, the hydrophobic fibers 14 are composed of a first material that is any one of $SiO_2$, $TiO_2$, ZnO, and ZnS, and a second material that is one or both of polystyrene and polyacrylonitrile. The hydrophobic fibers 14 are made of an inorganic-organic composite material, where the first material is an inorganic material which can ensure the firmness of the hydrophobic fibers 14, and the second material is an organic material which can ensure the cohesiveness of the hydrophobic fibers 14 and the adhesive material.

Figure 5:
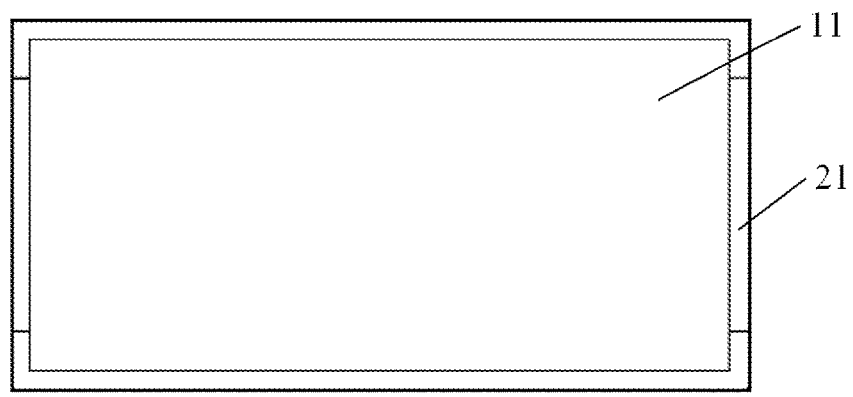
FIG. 5 is a still another schematic diagram of a display panel and a packaging device according to an embodiment of the present disclosure.

In another aspect, the present disclosure further provides a packaging device for manufacturing the hydrophobic fibers 14 provided in any one of the above implementations, the packaging device includes: as shown in FIG. 5, a plurality of pressing molds 21 that can be spliced together, the spliced pressing molds 21 can surround the packaging adhesive layer 12, a side of the pressing mold 21 proximal to the packaging adhesive layer 12 is provided with a preset region, the preset region is right opposite to the packaging adhesive layer 12, and the preset region is used for forming the hydrophobic fibers 14 therein. The packaging device is a mold for forming the hydrophobic fibers 14 on the display panel, as shown in FIG. 5, the packaging device is formed by splicing the plurality of pressing molds 21 together, the spliced pressing molds 21 can surround the packaging adhesive layer 12, where the pressing molds 21 can be made of materials which are not easy to bond with epoxy resin, such as polytetrafluoroethylene, polypropylene, polyethylene and the like. The pressing mold 21 may be plate-shaped, when the display panel is packaged, the pressing molds 21 may be attached to the sides of the panel body 11 and the cover plate 13, so that the preset areas on the pressing molds 21 faces the packaging adhesive layer 12, when the panel body 11 and the cover plate 13 are pressed together, the packaging adhesive layer 12 between the panel body 11 and the cover plate 13 is diffused, the packaging adhesive at edges of the packaging adhesive layer 12 is diffused to the hydrophobic fibers 14, so that the packaging adhesive layer 12 is bonded with the hydrophobic fibers 14, the packaging adhesive layer 12 is cured, and after the packaging adhesive layer 12 is cured, the pressing molds are removed, at this time, the hydrophobic fibers 14 are fixed on the peripheral sides of the packaging adhesive layer 12, and the hydrophobic fibers 14 are formed along the periphery of the packaging adhesive layer 12. When the display panel is to be packaged, the hydrophobic fibers 14 need to be first formed on the preset areas of the pressing molds 21. The hydrophobic fibers 14 grow in the preset areas of the pressing molds 21 in a growth mode induced by solvent volatilization, and specifically, when the hydrophobic fibers 14 are manufactured, the pressing molds 21 need to be placed in a solution, the hydrophobic fibers 14 grows in the preset areas of the pressing molds 21, and are arranged in an array, where in order to facilitate the growth of the hydrophobic fibers 14, the hydrophobic fibers 14 may be formed on all surfaces of the pressing molds 21.

The purpose of the present disclosure and solving the technical problems thereof can be further achieved by the following technical measures.

Figure 4:
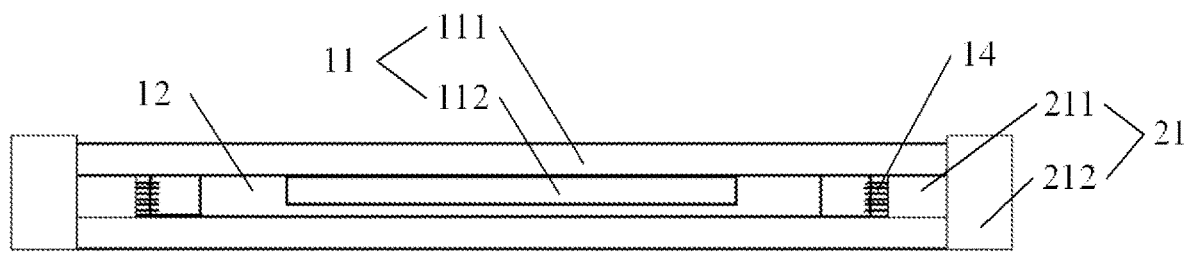
FIG. 4 is a further another schematic structural diagram of a display panel and a packaging device according to an embodiment of the present disclosure.

Specifically, as shown in FIGS. 2 to 4, the pressing mold 21 includes a plate-shaped body 211. The plate-shaped body 211 includes a first surface and a second surface which are opposite to each other, and further includes a third surface which is adjacent to the first surface and the second surface, the third surface is the preset area, the first surface is to be pressed together with the panel body 11, the second surface is to be pressed together with the cover plate 13, and the third surface is proximal to the packaging adhesive layer 12. When the hydrophobic fibers 14 formed on the peripheral sides of the packaging adhesive layer 12 are manufactured, the plate-shaped body 211 may be placed between the panel body 11 and the cover plate 13, where, when the plate-shaped body 211 is manufactured, a target thickness of a cell, that is, a distance between the substrate 111 of the panel body 11 and the cover plate 13 after the panel body 11 and the cover plate 13 are packaged, is required to be known in advance, and a thickness of the plate-shaped body 211, that is, a distance between the first surface and the second surface of the plate-shaped body 211, is determined according to the target thickness of the cell, for example, the plate-shaped body 211 may be manufactured into a plate having a thickness ranging from 5 μm to 30 μm. When the panel body 11 and the cover plate 13 are pressed together, the first surface of the plate-shaped body 211 is attached to the panel body 11, and the second surface of the plate-shaped body 211 is attached to the cover plate 13. The hydrophobic fibers 14 are manufactured on the third surface, and when the pressing molds 21 are used, the third surface faces the packaging adhesive layer 12.

Specifically, as shown in FIGS. 3 and 4, the pressing mold 21 further includes: a plate-shaped base 212 perpendicular to the panel body 211, the panel body 211 is formed as a convex structure on the base 212, a surface of the panel body 211, which is away from the base 212, is a preset surface, a surface of the base 212, which is provided with the panel body 211 thereon, is divided into a first limiting surface and a second limiting surface by the panel body 211, the first limiting surface is adjacent to the first surface of the panel body 211, the second limiting surface is adjacent to the second surface of the panel body 211, the first limiting surface is to be attached to a side of the panel body 211, which faces the base 212, and the second limiting surface is to be attached to a side of the cover plate 13, which faces the base 212. The plate-shaped base 212 and the plate-shaped body 211 are perpendicular to each other, the plate-shaped body 211 is positioned in a middle area of the base 212, but not at the edge of the base 212, and the plate-shaped body 211 and the base 212 form a convex structure like a side-placed Chinese character '凸', where a protrusion plane of the convex structure is the preset area. When the pressing molds 21 are used, the plate-shaped body 211 is disposed between the panel body 11 and the cover plate 13, the plate-shaped base 212 is disposed on the sides of the panel body 11 and the cover plate 13, and the base 212 is perpendicular to the panel body 11 and the cover plate 13, at this time, the first limiting surface of the base 212 is attached to the side of the panel body 11, and the second limiting surface of the base 212 is attached to the side of the cover plate 13, so that the base 212 can also limit the panel body 11 and the cover plate 13 in a horizontal direction, so that orthographic projections of the panel body 11 and the cover plate 13 in the horizontal direction of the drawings coincide.

In above-mentioned display panel, hydrophobic fibers are formed on the outer surfaces of the packaging structure, hydrophobic fibers have the hydrophobicity, and When the side of the display panel is full of moisture, the moisture cannot stay on the hydrophobic fibers, and thus can be avoided from entering the display panel from the side of the display panel, which can improve the sealing effect of the display panel, avoid the damage to the OLED device in the display panel and prolong the service life of the display panel.

In another aspect, as shown in FIG. 7, an embodiment of the present disclosure further provides a packaging method for packaging the display panel in the foregoing embodiment, where the packaging method includes the following steps S1 to S3.

In step S1, the hydrophobic fibers 14 are formed in the preset areas of the pressing molds 21, and the packaging adhesive layer 12 is formed on the cover plate 13 at the same time. Before the display panel is packaged, the hydrophobic fibers 14 are required to be formed on the pressing molds 21 in advance, and the hydrophobic fibers 14 can be transferred onto the peripheral sides of the packaging adhesive layer 12 through the pressing molds 21. The cover plate 13 is coated with the packaging adhesive layer 12 before the cover plate 13 and the panel body 11 are pressed together, so that after pressing, the packaging adhesive layer 12 can fix the cover plate 13 and the panel body 11, and most of moisture can be isolated.

In step S2, the pressing molds 21 are placed on the edges of the cover plate 13, so that the preset areas of the pressing molds 21 are right opposite to the peripheral side of the packaging adhesive layer 12. Since the packaging device is formed by splicing the pressing molds 21, the pressing molds 21 are sequentially fixed at the edges of the cover plate 13, so that the pressing molds 21 can surround the edges of the cover plate 13, that is, the pressing molds 21 surround the cover plate 13, the number of the pressing molds 21 may be set as needed, as long as these pressing molds 21 can surround the cover plate 13 after being combined together. The pressing mold 21 may be fixed to the edges of the cover plate 13 by other devices, and it is need to ensure that the preset areas provided with the hydrophobic fibers 14 are right opposite to the packaging adhesive layer 12.

In step S3, the panel body 11 and the cover plate 13 are pressed together, so that the packaging adhesive layer 12 is diffused to the hydrophobic fibers 14, and the hydrophobic fibers 14 in the preset areas are transferred to the sides of the packaging adhesive layer 12. When the panel body 11 and the cover plate 13 are pressed together, the packaging adhesive layer 12 coated on the cover plate 13 flows, so that the packaging adhesive layer between the cover plate 13 and the panel body 11 is uniformly distributed between the cover plate 13 and the panel body 11. Meanwhile, the packaging adhesive layer 12 diffuses to around in the pressing process, the packaging adhesive layer 12 is bonded with the hydrophobic fibers 14 in the diffusing process, and the hydrophobic fibers 14 on the pressing molds 21 can be transferred to the sides of the packaging adhesive layer 12 due to the fact that the cohesiveness between the hydrophobic fibers 14 and the pressing molds 21 is smaller than that between the hydrophobic fibers 14 and the packaging adhesive layer 12.

Then, the packaging adhesive layer 12 needs to be cured; the curing of the packaging adhesive layer 12 can be performed by means of ultraviolet irradiation and heating, which is well-known in the art and will not be described in detail herein. After the curing of the packaging adhesive layer 12, the pressing molds 21 may be removed. With the laterally film forming, the hydrophobic fibers 14 are formed on the peripheral sides of the packaging adhesive layer 12.

The specific process of coating the packaging adhesive layer 12 includes: coating the packaging adhesive frame 121 at positions at least 1 μm away from the edges of the cover plate 13, where the packaging adhesive frame 121 is strip-shaped, at this time, a reserved space with a width of at least 1 μm is formed between the packaging adhesive frame 121 and the edge of the cover plate 13, and meanwhile, the packaging adhesive frame 121 also encloses an accommodating space for accommodating the filling adhesive 122. The viscosity of the packaging adhesive frame 121 is relatively high, and the fluidity thereof is relatively low. The filling adhesive 122 may be distributed in the accommodating space in a dotted manner, or may be coated on the cover plate 13 in a shape like a Chinese character '回', and when the panel body 11 and the cover plate 13 are pressed together, the filling adhesive 122 may be diffused in the inner space, i.e., the accommodating space, of the packaging adhesive frame 121. The packaging adhesive frame 121 and the filling adhesive 122 on the cover plate are schematically illustrated in FIG. 2.

When the pressing molds 21 are installed, the plate-shaped body 211 is disposed in the reserved space, so that the preset areas of the plate-shaped body 211 are right opposite to the packaging adhesive frame 121. The plate-shaped body 211 is placed in the reserved space outside the packaging adhesive frame 121, where the outside of the packaging adhesive frame 121 refers to a side of the packaging adhesive frame 121 away from the filling adhesive, so that a distance between the packaging adhesive frame 121 and the pressing mold 21 is 1 µm. Then the panel body 11 and the cover plate 13 are pressed together, the packaging adhesive frame 121 is diffused towards the pressing molds 21 so as to adhesive the hydrophobic fibers 14, and finally the packaging adhesive frame 121 and the filling adhesive 122 are cured to complete packaging. In this case, the hydrophobic fibers 14 are left on the peripheral sides of the packaging adhesive frame 121, and finally the pressing molds 21 are removed. Here, the peripheral sides of the packaging adhesive frame 121 refer to sides of the packaging adhesive frame 121 proximal to the pressing molds. If the pressing mold further includes the plate-shaped base 212, the plate-shaped base 212 can be clamped on the side of the cover plate 13 when the pressing molds 21 are mounted, when the panel body 11 is placed, the side of the panel body 11 is attached to the first limiting surface of the base 212, the side of the cover plate 13 is attached to the second limiting surface of the base 212, and in the pressing process, the first limiting surface and the second limiting surface can limit the cover plate 13 and the panel body 11.

Figure 6:
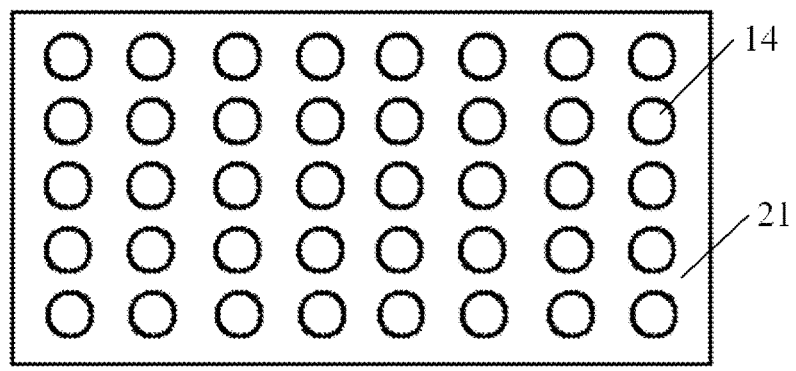
FIG. 6 is a schematic structural diagram of a package device according to an embodiment of the present disclosure.

As shown in FIG. 6, the hydrophobic fibers 14 are arranged in an array in the preset area of the plate-shaped body 211. In order to enable the hydrophobic fibers 14 to be uniformly arranged at the sides of the packaging adhesive layer 12, the hydrophobic fibers 14 are formed in an array when the hydrophobic fibers 14 are formed in the preset area of the plate-shaped body 211.

In the display panel manufactured through above-mentioned embodiment, hydrophobic fibers are formed on outer surfaces of the packaging structure, the hydrophobic fibers have the hydrophobicity, when the sides of the display panel is full of moisture, the moisture cannot stay on the hydrophobic fibers, and thus can be avoided from entering the display panel from the sides of the display panel, so that the sealing effect of the display panel is improved, the damage to the OLED device in the display panel can be avoided, and the service life of the display panel can be prolonged.

An embodiment of the present disclosure further provides a display device, which includes the display panel described in the foregoing embodiment, and for a specific structure of the display panel, reference may be made to the foregoing embodiment, which is not described herein again.

Note that, the display device in the present disclosure may be any product or component with a display function, such as electronic paper, an OLED panel, a mobile phone, a tablet computer, a television, a display, a notebook computer, a digital photo frame, a navigator.

In the display device of the present embodiment, hydrophobic fibers are formed on outer surfaces of the packaging structure, the hydrophobic fibers have the hydrophobicity, when the sides of the display panel is full of moisture, the moisture cannot stay on the hydrophobic fibers, and thus can be avoided from entering the display panel from the sides of the display panel, so that the sealing effect of the display panel is improved, the damage to the OLED device in the display panel can be avoided, and the service life of the display panel can be prolonged.

The above description is only for the specific embodiments of the present disclosure, but the scope of the present disclosure is not limited thereto, and any ordinary skilled person in the art can easily think of changes or substitutions within the technical scope of the present disclosure, and these changes or substitutions shall fall within the scope of the present disclosure. Therefore, the protection scope of the present disclosure should be defined by the claims.

The invention claimed is:

1. A display panel, comprising:
 a panel body comprising a substrate and a functional layer on the substrate;
 a packaging layer on a surface of the panel body;
 a cover plate on a surface of the packaging layer away from the panel body;
 a filling adhesive located between the cover plate and the panel body and completely wrapping the functional layer, wherein
 the packaging layer comprises a packaging adhesive layer and hydrophobic fibers, the packaging adhesive layer packages the panel body and the cover plate, the packaging adhesive layer is arranged around an outer periphery of the filling adhesive, and the hydrophobic fibers are located on outer peripheral sides of the packaging adhesive layer.

2. The display panel of claim 1, wherein
 the hydrophobic fibers are fluffy and are densely arranged on the peripheral sides of the packaging adhesive layer.

3. The display panel of claim 2, wherein
 the hydrophobic fibers are located on the peripheral sides of the packaging adhesive layer in an array comprising a plurality of rows and a plurality of columns.

4. The display panel of claim 2, wherein
 the hydrophobic fibers have a length ranging from 1 µm to 5 µm and a diameter ranging from 10 nm to 100 nm.

5. The display panel of claim 1, wherein
 the packaging adhesive layer comprises a packaging adhesive frame and a filling adhesive, the packaging adhesive frame is positioned at a preset distance from edges of the cover plate, the packaging adhesive frame encloses an annular accommodating space on the cover plate, the filling adhesive is located in the accommodating space, and
 the hydrophobic fibers are located on the peripheral sides of the packaging adhesive frame away from the filling adhesive.

6. The display panel of claim 1, wherein
 the hydrophobic fibers are composed of a first material and a second material, the first material is any one of $SiO_2$, $TiO_2$, ZnO and ZnS, and the second material is one or two of polystyrene and polyacrylonitrile.

7. The display panel of claim 1, wherein the display panel is an OLED display panel.

8. A display device, comprising the display panel of claim 1.

9. The display panel of claim 1, wherein
 the packaging adhesive layer is made of epoxy resin.

10. A packaging device for forming the hydrophobic fibers of the display panel, the display panel comprising: a panel body; a packaging layer on a surface of the panel body; a cover plate on a surface of the packaging layer away from the panel body, the packaging layer comprising a packaging adhesive layer and hydrophobic fibers, the packaging adhesive layer packaging the panel body and the cover plate, and the hydrophobic fibers being located on peripheral sides of the packaging adhesive layer, wherein
 the packaging device comprising:
 a plurality of pressing molds that are spliced, the spliced pressing molds surround the packaging adhesive layer, each of the pressing molds is provided with a preset area on a side thereof proximal to the packaging adhesive layer, after the plurality of pressing molds are spliced together, each preset area is right opposite to the packaging adhesive layer, and each preset area is provided with the hydrophobic fibers in advance.

11. The packaging of claim 10, wherein
each pressing mold comprises a plate-shaped body, the plate-shaped body comprises a first surface and a second surface which are opposite to each other, and further comprises a third surface which is adjacent to the first surface and the second face, the third surface is the preset area, the first surface is configured to be pressed together with a surface, proximal to the cover plate, of the panel body, the second surface is configured to be pressed together with a surface, proximal to the panel body, of the cover plate, and the third surface is proximal to the packaging adhesive layer.

12. The packaging of claim 11, wherein
each pressing mold further comprises: a plate-shaped base, which is coupled to a surface, away from the third surface, of the plate-shaped body and is perpendicular to the plate-shaped body, the plate-shaped body is formed into a protruding structure on the plate-shaped base, a surface, coupled to the plate-shaped body, of the plate-shaped base is divided into a first limiting surface and a second limiting surface by the plate-shaped body, the first limiting surface is adjacent to the first surface of the plate-shaped body, the second limiting surface is adjacent to the second surface of the plate-shaped body, the first limiting surface is configured to be attached to the side of the panel body, and the second limiting surface is configured to be attached to the side of the cover plate.

13. A packaging method for packaging a display panel, the display panel comprising: a panel body; a packaging layer on a surface of the panel body; a cover plate on a surface of the packaging layer away from the panel body, the packaging layer comprising a packaging adhesive layer and hydrophobic fibers, the packaging adhesive layer packaging the panel body and the cover plate, and the hydrophobic fibers being located on peripheral sides of the packaging adhesive layer, wherein
the packaging method comprising:
forming hydrophobic fibers in preset areas of the pressing molds;
forming a packaging adhesive layer on the cover plate;
splicing and mounting the pressing molds on the edges of the cover plate, so that the preset areas of the pressing molds are right opposite to the peripheral sides of the packaging adhesive layer; and
pressing the panel body and the cover plate together to ensure that the packaging adhesive layer is diffused to the hydrophobic fibers and the hydrophobic fibers in the preset areas of the pressing molds are transferred to the peripheral sides of the packaging adhesive layer.

14. The packaging method of claim 13, wherein
the hydrophobic fibers are formed into an array comprising a plurality of rows and a plurality of columns.

15. The packaging method of claim 13, wherein
the hydrophobic fibers have a length ranging from 1 μm to 5 μm and a diameter ranging from 10 nm to 100 nm.

16. The packaging method of claim 13, wherein
the hydrophobic fibers are formed by using a lateral film forming process.

17. The packaging method of claim 13, further comprising:
after the hydrophobic fibers are transferred to the peripheral sides of the packaging adhesive layer, curing the packaging adhesive layer; and after the packaging adhesive layer is cured, removing the pressing molds.

18. The packaging method of claim 17, wherein the curing the packaging adhesive layer further comprises:
curing the packaging adhesive layer by using ultraviolet irradiation and heating.

19. The packaging method of claim 13, wherein the forming hydrophobic fibers in preset areas of the pressing molds further comprises:
growing the hydrophobic fibers in the preset areas of the pressing molds in a growth mode induced by solvent volatilization.

20. The packaging method of claim 13, wherein the forming hydrophobic fibers in preset areas of the pressing molds further comprises:
forming the hydrophobic fibers by using a first material and a second material, the first material is any one of $SiO_2$, $TiO_2$, ZnO and ZnS, and the second material is one or two of polystyrene and polyacrylonitrile.

* * * * *